(12) United States Patent
Andreev et al.

(10) Patent No.: US 6,467,067 B1
(45) Date of Patent: Oct. 15, 2002

(54) ε-DISCREPANT SELF-TEST TECHNIQUE

(75) Inventors: Alexander E. Andreev, San Jose, CA (US); Ranko Scepanovic, San Jose, CA (US); Lav Ivanovic, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/879,845

(22) Filed: Jun. 12, 2001

(51) Int. Cl.[7] .............................................. G06F 17/50
(52) U.S. Cl. .............................................. 716/4; 716/18
(58) Field of Search .............................. 716/4, 16, 17, 716/18

(56) References Cited

U.S. PATENT DOCUMENTS 5,475,624 A * 12/1995 West .............................. 716/4
5,506,852 A * 4/1996 Chakradhar et al. ........... 716/4
5,513,123 A * 4/1996 Dey et al. ...................... 716/4
6,345,379 B1 * 2/2002 Khouja et al. ................. 716/4

* cited by examiner

Primary Examiner—Trong Phan
(74) Attorney, Agent, or Firm—Westman, Champlin & Kelly

(57) ABSTRACT

A test signal is propagated through at least a portion of the circuit from a respective input. The test signal is based on a row of a k-wise, ε-discrepant matrix. Cells are identified whose outputs have a constant response to the test signal and the inputs of the identified cells are combined with the inputs of the circuit. The process is iteratively repeated until the output of the circuit is reached. The circuit inputs and inputs of identified cells are selected as test points.

20 Claims, 4 Drawing Sheets

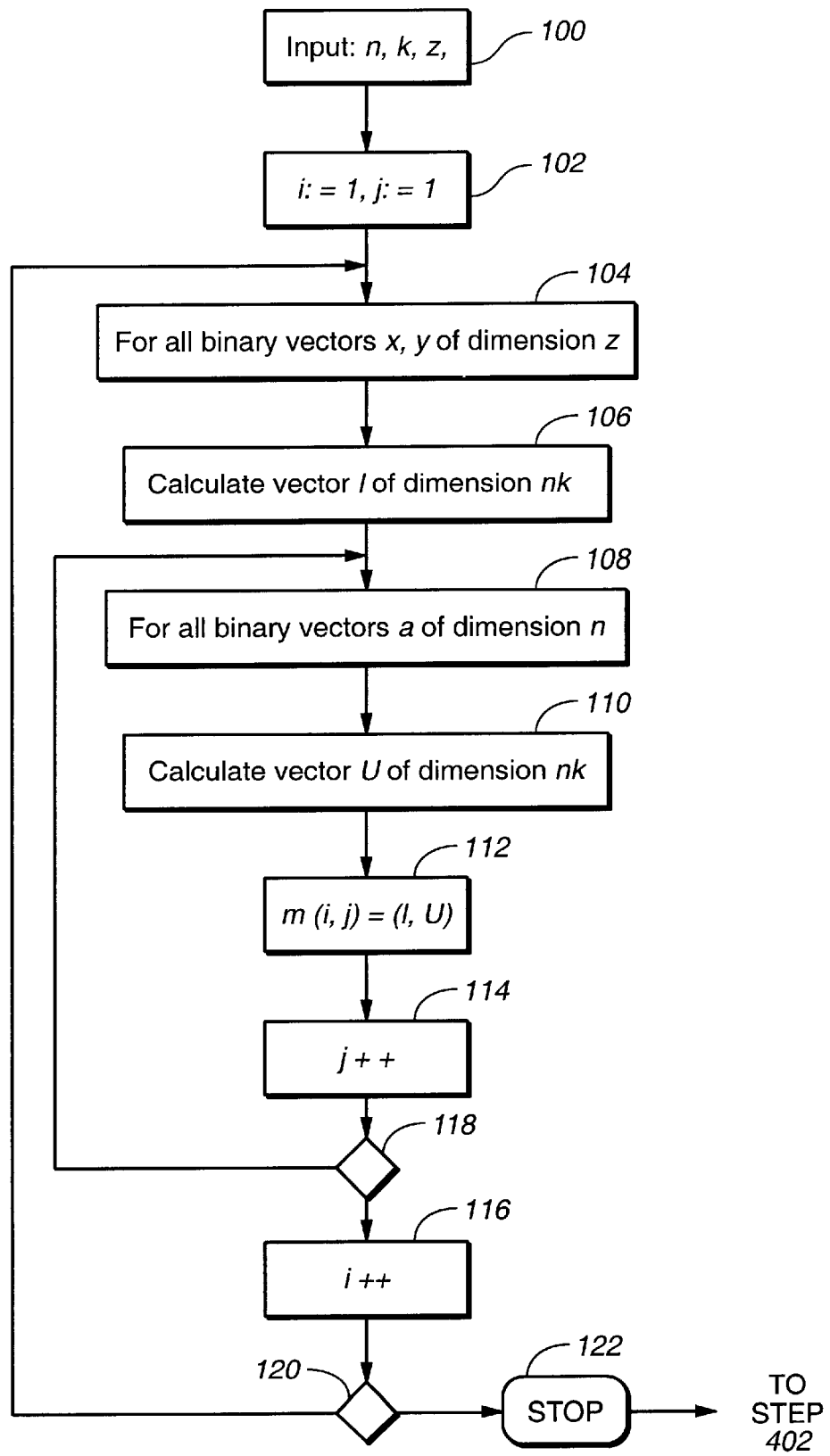
FIG._1

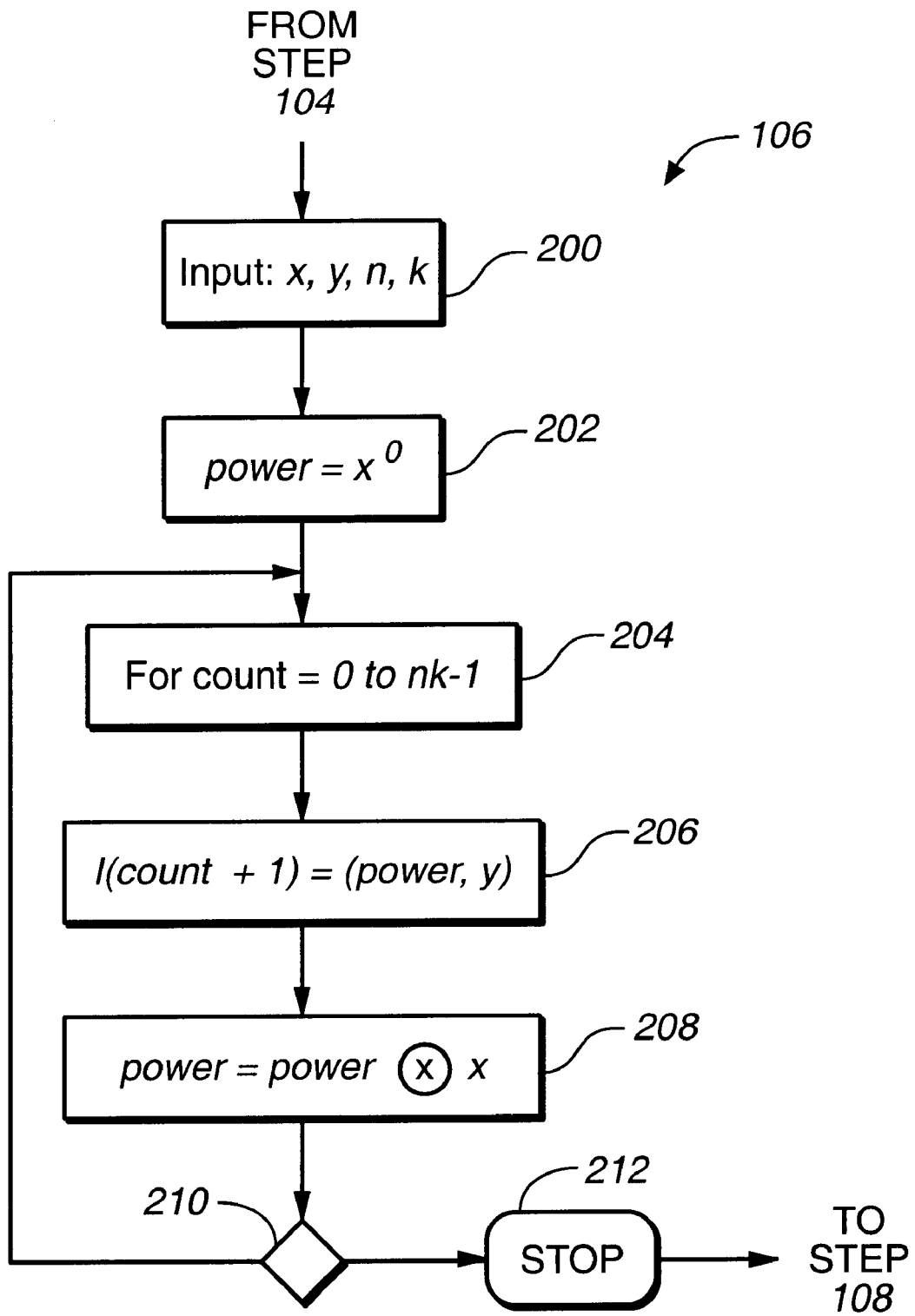
FIG._2

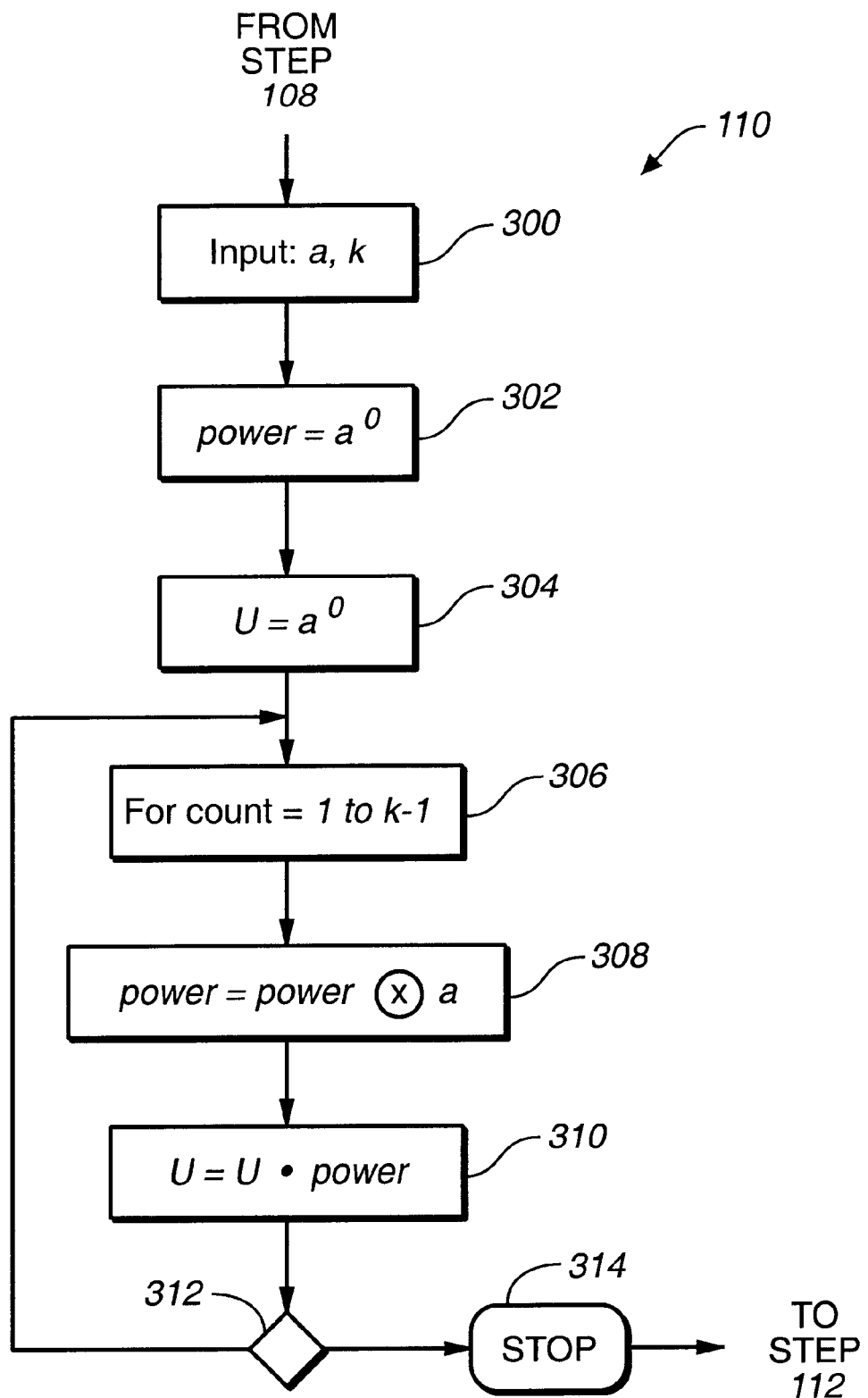
FIG._3

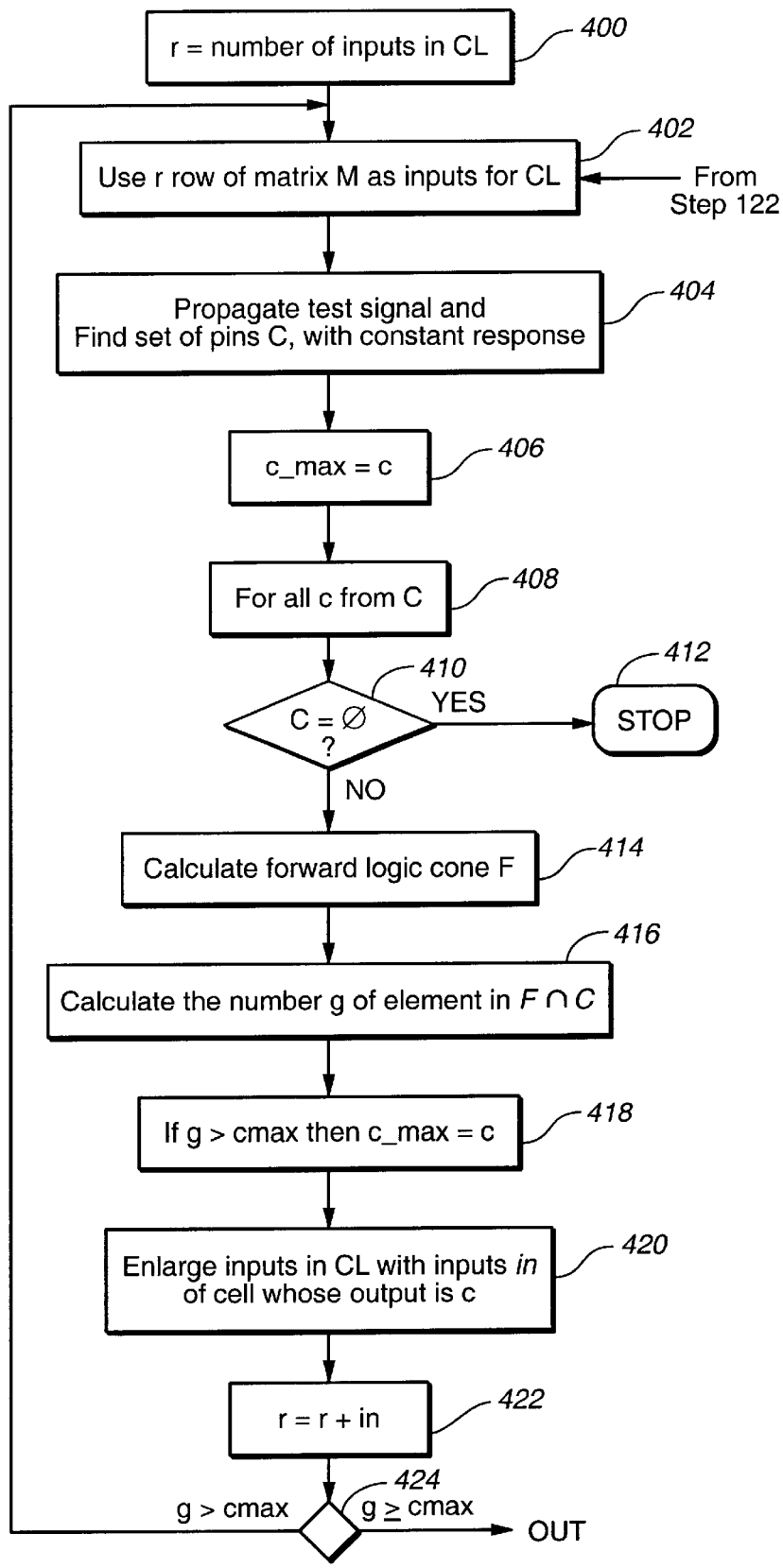
FIG._4

ε-DISCREPANT SELF-TEST TECHNIQUE

FIELD OF THE INVENTION

This invention relates to circuit testing techniques, and particularly to using test vectors generated as epsilon-discrepant sets for test point insertion into integrated circuits (ICs).

BACKGROUND OF THE INVENTION

Conventional logic built-in self test techniques employ linear feed-back shift registers to generate a pseudo-random bit sequence that is shifted into scan chains. The bits in the scan chain serve as test patterns for the circuit under test. However, pseudo-random bit sequences contain random pattern resistant faults, in the form of non-random bit sequences that resist the random nature of the bit pattern. These faults limit the test patterns used in the test, and hence the extent of the test.

SUMMARY OF THE INVENTION

The present invention is directed to a technique of test point insertion using test vectors generated as an epsilon-discrepant set.

In one embodiment, test points of an electronic circuit, such as an IC, having a plurality of cells and a plurality of circuit inputs are selected. A test signal is propagated through at least a portion of the circuit from each test point. Each test signal is based on a respective row of a k-wise, epsilon-discrepant matrix. Cells are identified having outputs that have a constant response to the test signal. The test points are selected as the inputs of the identified cells and the inputs of the circuit. The process is iteratively repeated until the output of the electronic circuit is reached.

In some embodiments, the set of test signals contains respective pseudo-random bit sequences. A k-wise, epsilon-discrepant matrix is constructed containing a plurality of rows of bits arranged in columns. Separate rows of the matrix are selected as separate test signals of the set.

Preferably, the matrix is constructed by constructing a first vector, l, of dimension nk, based on binary vector x,y, where n is an integer. A second vector, U, of dimension nk, is constructed based on binary vector a. Respective elements of the first and second vectors are selected as elements of the matrix such that the elements of the matrix are arranged into $2^{2z}$ rows and $2^n$ columns, where z is derived from the relationship $kn2^{-z}<2^{-k}$.

In preferred embodiments, a computer-readable medium stores computer executable process steps to generate the matrix and test a computer simulation of the electronic circuit. Preferably, a netlist for the electronic circuit defines both the electronic circuit under test and the matrix generator for use in a Logic Built-In Self-Test (LBIST) system. The computer generates the matrix, and selects rows of the matrix to serve as members of the set of test signals for the LBIST system.

BRIEF DESCRIPTION OF THE DRAWINGS

FIGS. 1–4 are flow diagrams illustrating various steps in the process of testing circuits according to an embodiment of the present invention.

DETAILED DESCRIPTION OF THE PREFERRED EMBODIMENTS

The present invention is directed to the use of a k-wise ε-discrepant set M of test signals for testing circuits. One advantage of the technique is that each bit of the test vectors can be calculated separately and still retain strong pseudo-random and coverage characteristics. Because the epsilon-discrepant set is deterministic, the number of scan chains and their distribution has no influence on test vector generation.

The Affine subspace, AFF(n,k,s), is the set of pairs (A,b) of matrix A and vector b, where matrix $A \in E\{0,1\}^{s \times n}$ and vector $b \in \{0,1\}^s$ are such that Ax=b for some $x \in \{0,1\}^n$ and every row of matrix A has less than k non-zero elements. Set M is ε-discrepant for linear systems if the probability of choosing the solution of the linear system from set M is about equal to the probability of choosing the solution from the entire space. More formally, a set $M \subseteq \{0,1\}^i$ is ε-discrepant for AFF(n,k,s) if $|Pr_s(A,b)-2^{-s}| \leq \epsilon$, for any feasible system $(A,b) \in AFF(n,k,s)$ with rank(A)=s, where $Pr_M(A,b)$ is the probability that x is the chosen solution of the equation Ax=b and x is chosen uniformly at random from M. Set M is k-wise ε-discrepant if linear systems from the previous definition can have at most k non-zero coefficients.

From the above, construction of a k-wise ε-discrepant set M is accomplished by defining (using finite field techniques) multiplication ($a \hat{\times} b$) and the powers ($x^i$) of the vector $x \in \{0,1\}^z$. Consequently, the inner product of two vectors $a,b \in \{0,1\}^z$ can be defined as $(a,b)=(a_1 b_1 \hat{\times} a_2 b_2 \hat{\times} \ldots \hat{\times} a_1 b_1)$. Consequently, the powering sample space of a vector l, where $l \in \{0,1\}^{kn}$, is defined such that i-th bit of l is $(x^i,y)$ for some pair of vectors $x,y \in \{0,1\}^z$, where y is a vector of dimension z. Thus, vector l is calculated as $x^0$,y, $x^1$,y, $x^2$,y, ... $x^{nk-1}$,y. For any given element $a \in \{0,1\}^n$ and integer k>0, the powers $U(a,k) \in \{0,1\}^{kn}$ are concatenated as $U(a,k)=a^0 \cdot a^1 \cdot \ldots \cdot a^{k-1}$. The elements of the matrix M are calculated from vectors l and U as $m_{i,j}=(l_i,U(a_j,k))$, where $l_i \in L_{kn,z}$ and $a_j \in \{0,1\}^n$. The resulting matrix M has $2^{2z}$ rows and $2^n$ columns. If parameter z is chosen such that $kn2^{-z}<2^{-k}$, matrix M will exhaustively cover all k-subspaces. Moreover, each element $m_{i,j}$ of matrix M can be calculated on the fly.

FIG. 1 is a flow diagram illustrating the process for construction of the k-wise ε-discrepant matrix set M for use in the present invention. At step 100, the values of the parameters for n, k and z. Parameter z is chosen so that $kn2^{-z}<2^{-k}$ so that the resulting matrix will exhaustively encompass all k-subspaces. At step 102, i and j are each set to 1, and the process begins at step 104 for a binary vector x,y of dimension z. At step 106, vector l of dimension nk is calculated. The process for construction of vector l is more fully described in connection with FIG. 2. The process commences at step 108 that for each binary vector a of dimension n, vector U is calculated having a dimension nk at step 110. FIG. 3 is a flow diagram illustrating the process for construction of vector U.

The result at step 112 is an element m(i,j) of matrix M that is equal to the calculated vectors l and U. For example, in the first iteration of the process, where i and j are each equal to 1, m(1,1) equals $l_1,U_1$. At step 114, the process increments the value of j (indicated by j++) and loops back through step 118 to compute new vectors a of dimension n and the vector U of dimension nk. Consequently, at the successive iterations of step 112, elements of matrix M consist of m(1,1)= $(l_1,U_1)$, m(1,2)=$(l_1,U_2)$, ...,m(1,j)=$(l_1,U_j)$.

Upon completion of the loop through all values of j, the value of i is incremented at step 116 (indicated by i++), and the value of j is returned to 1. The process loops back through step 120 to step 104 to calculate vector 1 to derive elements of matrix M as $m(2,1)=(l_2,U_1)$, $m(2,2)=(l_2,U_2), \ldots, m(i_{max},j_{max})=(l_{i-max},U_{j-max})$. Upon exhaustion of the values of i, the process ends at step 122 with the completed matrix M, whose elements m are arranged in $2^{2z}$ rows and $2^n$ columns, which is supplied to step 402 for use in the test point determination of FIG. 4.

FIG. 2 illustrates the process 106 for construction of vector l employing, at step 200, inputs of parameters x, y, n and k are received from step 104 (FIG. 1). At step 202, a power is identified as equal to $x^0$, and at step 204, the process begins. The process is carried out with counts between 0 and nk−1. At step 206, the element of vector l is set equal to the pair defined by the power and y. With the count equal to 0, $1(1)=(1,y)$. At step 208, multiplication of x to the power of x is calculated (which effectively increments the power of x to $x^1$), and the process loops back through decision step 210 to step 202 increasing the count to 1. Consequently, element $1(2)$ is calculated as equal to $x^1,y$. The process continues to loop through step 210 until the count reaches nk−1 to complete calculation of vector l as $1,y, x,y, x^2,y, \ldots, x^{nk-1},y$. When the calculation of vector l is complete, process 106 ends at 212 to return to step 108 (FIG. 1).

FIG. 3 illustrates a similar process 110 for construction of vector U using the inputs of parameters a and k from step 108 (FIG. 1) at step 300, setting the power of a to 0 at step 302 and setting the first element of vector U equal to $a^0$, or 1, at step 304. At steps 306 and 308 the power of a is incremented from 1 to k−1. Consequently, the second element of vector U is $a^1$, or a. At step 310, the element U(2) is identified as equal to the previous value of U(1) multiplied by the power identified in step 308. Since there is no previous U(0), the value of U(1) is $a^0$. The process continues to loop through step 312 through counts 2 to k−1 to derive the vector $U(a,k)=a^0 \cdot a^1 \cdot \ldots \cdot a^{k-1}$, whereupon process 110 ends at step 314 and the vector is supplied to step 112 (FIG. 1).

While matrix M has very good characteristics, 100% fault coverage requires the use of control test points. FIG. 4 is a flow diagram illustrating the basic concept for finding test points. Principally, test signals, based on respective rows of matrix M, are propagated from respective inputs of the circuit under test. The number of rows of matrix M selected for test signals equals the number of inputs to the circuit. The inputs of each cell having a constant response to the propagated signal are treated as inputs added to the circuit under test. During successive iterations, the number of rows of matrix M contributing to the test signals is increased, based on the added inputs of the cells whose outputs have a constant response.

At step 400, the number, r, of inputs in the combination logic of the circuit under test is identified. At step 402, matrix M is received from step 122 (FIG. 1) and the first r rows of matrix M are selected for use as test signals (row by row). At step 404, a test signal is propagated through the circuit under test from a respective input pin of the circuit using a respective one of the rows of matrix M as the test signal. All cells, c, having an output pin C exhibiting constant response are identified. At step 406, the number of cells $c_{max}$ having an output with a constant response is identified and at step 408 the process commences for each cell c having an output pin C having a constant response. If, at step 410, there is no pin C with a constant response, the process ends at step 412. If at least one pin C has a constant response, a forward logic cone F is calculated at step 414 from the cell c, and the number of elements g at the intersections of the forward logic cones and pins C are identified. At step 418, if g is greater than $c_{max}$, then c is set equal to $c_{max}$ for the next iteration. At step 420, the inputs of the cells are added as new inputs to the circuit under test, and at step 422, the value of r is changed to include the number of input pins of the cells. The process loops back at step 424 to step 402 to select the new value of r rows of matrix M as the test vectors.

The process continues to iterate through the process until the output of circuit under test is reached. When the output of the circuit under test is reached, g will not be greater than $c_{max}$ ($g \leq c_{max}$), so the process ends. All of the circuit inputs, r, and all of the inputs found for cells having outputs with constant response are identified as test points for the circuit under test.

In preferred embodiments of the invention, the matrix generator is implemented in the circuit under test and is defined by the netlist of the circuit. More particularly, the netlist for the circuit includes first netlist data that defines the electronic circuit and is used by the data processing system to simulate the electronic circuit. The netlist for the circuit includes second netlist data that is used by the data processing system to simulate the k-wise epsilon-discrepant matrix generator defining the matrix. The circuit is tested using a Logic Built-In Self-Test (LBIST) system that propagates test signals through portions of the circuit from respective test points. Each test signal is based on a respective row of the matrix. In some embodiments, the computer simulates the circuit and also tests the simulated circuit using a simulation of the matrix generator defined by LBIST system. In other embodiments, the results of the test on the simulated circuit are be compared to results of a test on a physical circuit fabricated as defined by the netlist. The results of a comparison of the simulation test to a test on the physical circuit may be employed for a variety of purposes, including verification of design, fabrication processing, and conformance to design specifications.

The resulting k-wise, epsilon-discrepant matrix is particularly useful because non-random bit sequences found in other pseudo-random test signals are absent from the test signal generated from the matrix. As a result, the extent of the test can be increased.

Although the present invention has been described with reference to preferred embodiments, workers skilled in the art will recognize that changes may be made in form and detail without departing from the spirit and scope of the invention.

What is claimed is:

1. A process of selecting test points of a circuit having a plurality of cells and a plurality of circuit inputs, comprising steps of:
   a) propagating a test signal through at least a portion of the circuit from a respective test point, the test signal being based on a row of a k-wise, epsilon-discrepant matrix;
   b) identifying cells whose outputs exhibit a constant response to the test signal; and
   c) selecting the test points as the circuit inputs and inputs of the cells identified in step (b).

2. The process of claim 1, wherein step (c) includes:
   c1) identifying a plurality of test points as the circuit inputs,
   c2) identifying inputs of each cell whose output exhibits a constant response to the test signal, and
   c3) including the cell inputs identified in step (c2) in the plurality of test points.

3. The process of claim 2, wherein step (c) further includes:
- c4) identifying a set of cell outputs, C, having the constant response,
- c5) calculating a number of intersections, g, between a forward logic cone calculated from a cell identified in step (b) and the set C of cell outputs,
- c6) comparing g to a number of cells, $c_{max}$, whose inputs are identified in step (c2), and
- c7) repeating steps (a) and (b) if $g > c_{max}$, or selecting the test points resulting from step (c3) if $g \leq c_{max}$.

4. The process of claim 1, further including:
- d) iteratively repeating steps (a) and (b) until an output of the circuit is reached.

5. The process of claim 4, wherein step (a) includes, for a given iteration,
- a1) accumulating a selection of rows of the matrix equal in number to the circuit inputs and the inputs of cells identified in step (b) of all prior iterations,
- a2) basing a test signal on each selected row for a respective input, and
- a3) selecting a number of additional rows of the matrix equal to the inputs of cells identified in step (b) for an iteration following the prior iterations.

6. The process of claim 1, wherein step (a) includes steps of:
- a1) constructing a k-wise, epsilon-discrepant matrix containing a plurality of rows of bits arranged in columns; and
- a2) selecting separate rows of the matrix as separate test signals of the set.

7. The process of claim 6, wherein step (a1) includes steps of:
- i) constructing a first vector, l, of dimension nk, based on binary vector x,y, where n is an integer,
- ii) constructing a second vector, U, of dimension nk, based on binary vector a,
- iii) selecting respective elements of the first and second vectors as elements of the matrix, and
- iv) arranging the elements of the matrix into $2^{2z}$ rows and $2^n$ columns, where z is derived from $kn2^{-z} < 2^{-k}$.

8. The process of claim 7, wherein step (i) includes steps of:
- incrementing a power of x from $x^0$ to $x^{nk-1}$, and
- constructing l as $1, y, x, y, x^2, y, \ldots, x^{nk-1}, y$.

9. The process of claim 7, wherein step (ii) includes steps of:
- incrementing a power of a from $a^1$ to $a^{k-1}$, and
- constructing U as $1 \cdot a \cdot a^2 \cdot \ldots \cdot a^{k-1}$.

10. A process of constructing a set of test signals containing respective pseudo-random bit sequences comprising steps of:
- a) constructing a k-wise, epsilon-discrepant matrix containing a plurality of rows of bits arranged in columns; and
- b) selecting separate rows of the matrix as separate test signals of the set.

11. The process of claim 10, wherein step (a) includes steps of:
- a1) constructing a first vector, l, of dimension nk, based on binary vector x,y, where n is an integer,
- a2) constructing a second vector, U, of dimension nk, based on binary vector a,
- a3) selecting respective elements of the first and second vectors as elements of the matrix, and
- a4) arranging the elements of the matrix into $2^{2z}$ rows and $2^n$ columns, where z is derived from $kn2^{-z} < 2^{-k}$.

12. The process of claim 11, wherein step a1) includes steps of:
- incrementing a power of x from $x^0$ to $x^{nk-1}$, and
- setting each element of vector l as the incremental power of x and y.

13. The process of claim 11, wherein step a1) includes steps of:
- incrementing a power of x from $x^0$ to $x^{nk-1}$, and
- constructing l as $1, y, x, y, x^2, y, \ldots, x^{nk-1}, y$.

14. The process of claim 11, wherein step a2) includes steps of:
- incrementing a power of a from $a^1$ to $a^{k-1}$, and
- constructing vector U having successive elements each consisting of a next prior element concatenated with the incremental power of a.

15. The process of claim 11, wherein step a2) includes steps of:
- incrementing a power of a from $a^1$ to $a^{k-1}$, and
- constructing U as $1 \cdot a \cdot a^2 \cdot \ldots \cdot a^{k-1}$.

16. A computer-readable medium storing computer-executable process steps for synthesizing and testing a simulated electronic circuit by a data processing system, the process steps comprising steps of:
- a) propagating respective test signals through at least respective portions of the simulated electronic circuit from respective test points, each test signal being based on a respective row of an epsilon-discrepant matrix,
- b) identifying cells of the simulated electronic circuit having outputs exhibiting a constant response to the test signal, and
- c) selecting the test points as inputs to the simulated electronic circuit and of the cells identified in step (b).

17. The computer-readable medium of claim 16, further encoded with data comprising:
- first netlist data for use by the data processing system to simulate a description of the electronic circuit, and
- second netlist data for use by the data processing system to simulate a description of an epsilon-discrepant matrix generator defining the matrix.

18. The computer-readable medium of claim 16, wherein step (c) comprises steps of:
- c1) identifying a plurality of test points as inputs to the simulated electronic circuit,
- c2) identifying inputs of each cell whose output exhibits a constant response to a test signal, and
- c3) including the inputs identified in step (c2) in the plurality of test points.

19. The computer-readable medium of claim 18, wherein step (c) further includes:
- c4) identifying a set of cell outputs, C, having the constant response,
- c5) calculating a number of intersections, g, between a forward logic cone calculated from a cell identified in step (b) and the set C of cell outputs,
- c6) comparing g to a number of cells, $c_{max}$, whose inputs are identified in step (c2), and
- c7) repeating steps (a) and (b) if $g > c_{max}$, or selecting the test points resulting from step (c3) if $g \leq c_{max}$.

20. The computer-readable medium of claim 16, further including:

d) iteratively repeating steps (a) and (b) until an output of the circuit is reached, and wherein step (a) includes, for a given iteration,
   a1) accumulating a selection of rows of the matrix equal in number to the inputs of the circuit and the inputs of cells identified in step (b) of all prior iterations,
   a2) basing a test signal on each selected row for a respective input, and
   a3) selecting a number of additional rows of the matrix equal to the inputs of cells identified in step (b) for an iteration following the prior iterations.

* * * * *